United States Patent [19]
Schulz et al.

[11] 3,931,420
[45] Jan. 6, 1976

[54] TEMPERATURE COMPENSATED ACOUSTIC SURFACE WAVE DEVICE

[75] Inventors: Manfred B. Schulz, Sudbury; Melvin G. Holland, Lexington, both of Mass.

[73] Assignee: Raytheon Company, Lexington, Mass.

[22] Filed: May 14, 1973

[21] Appl. No.: 359,801

Related U.S. Application Data

[62] Division of Ser. No. 185,601, Oct. 1, 1971, Pat. No. 3,786,373.

[52] U.S. Cl. ............... 427/100; 427/258; 427/271; 427/331
[51] Int. Cl.² ........................................... B05D 5/12
[58] Field of Search ............ 117/212, 217; 427/100, 427/258, 331, 271

[56] References Cited
UNITED STATES PATENTS

| | | |
|---|---|---|
| 3,347,703 | 10/1967 | Engelman et al. ................. 117/217 |
| 3,385,731 | 5/1968 | Weimer ............................... 117/212 |
| 3,388,002 | 6/1968 | Foster ................................. 117/217 |
| 3,409,464 | 11/1968 | Shiozawa ........................... 117/217 |
| 3,469,120 | 9/1969 | Nagao et al. ....................... 117/217 |
| 3,573,960 | 4/1971 | Duncan .............................. 117/217 |

*Primary Examiner*—Cameron K. Weiffenbach
*Attorney, Agent, or Firm*—John R. Inge; Joseph D. Pannone; Milton D. Bartlett

[57] ABSTRACT

A temperature compensated acoustic surface wave device, such as a surface wave delay line is provided in which temperature compensation is provided by the deposition of an interdigital electrode structure on a substrate with an overlay film surface of piezoelectric material of a predetermined thickness. A double substrate arrangement is also disclosed in which the interdigital electrode structure is deposited upon the surface of a non-piezoelectric layer which in turn is placed upon the surface of a piezoelectric substrate.

10 Claims, 12 Drawing Figures

TEMPERATURE COMPENSATED ACOUSTIC SURFACE WAVE DEVICE

This is a division of application Ser. No. 185,601, filed Oct. 1, 1971, now U.S Pat. No. 3,786,373.

BACKGROUND OF THE INVENTION

This invention relates to piezoelectric surface electroacoustic surface wave devices and systems which make use of such devices and more particularly to electroacoustic surface wave devices comprising arrays of interdigital electrode structures depositioned either between or upon the surface of piezoelectric and non-piezoelectric substrate structures, to minimize or eliminate the composite temperature coefficient of delay of the electroacoustic surface wave device, to improve the coupling efficiency and to reduce the dispersion in devices made with layers of zinc oxide, bismuth, germinate, lithium niobate, barium sodium niobate and other well-known piezoelectric materials which will transmit ultrasonic waves at frequencies of several hundred megacycles.

Acoustic surface wave devices offer several advantages in the construction of delay lines and filters in the UHF range in such systems as radar using linear chirp waveforms, comb structures and broad band delay lines and in systems requiring frequency response to phase coded signals, linear FM signals, nonlinear FM signals, and signals with special coding for use with matched filter devices. In these and other devices the frequency response is determined by the interdigital finger spacing and overlap of the interdigital comb structures used as input and output transducers.

It is known that an acoustic surface wave delay line can be constructed by bringing into close proximity with one another a flat piezoelectric material and a flat non-piezoelectric material having interdigital electrode structures at their mating surfaces. In the *Journal of Applied Physics*, volume 39, page 5400, 1968, in an article by P. O. Lopen, such a structure is disclosed; however, the temperature coefficient of delay is such that there are significant losses, hence the device is not suitable for use in applications where an extremely small or zero temperature coefficient may be achieved as in accordance with the present invention. This is important in delay line applications in which matched filters are required for pulse or phase coded operations or in generalized filter applications such as radar requiring pulse expansion and compression, communication systems requiring encoders and decoders, and band-pass and wave shaping applications requiring precise filters. The use of high coupling piezoelectric materials is desirable because it allows large bandwidth with minimum insertion loss.

SUMMARY OF THE INVENTION

A surface wave electroacoustic delay line with a substantially zero temperature coefficient of delay is disclosed in which interdigital electrode arrays are disposed upon a substrate which may or may not be piezoelectric with an overlap film of either piezoelectric or non-piezoelectric material deposited thereover, forming a sandwich structure. The electrodes may be deposited on the upper surface where one layer is piezoelectric. It has been discovered that the temperature coefficient of delay may be made substantially zero in such a structure when the thickness to wavelength ratio of the piezoelectric layer is a predetermined value, which for zinc oxide on fused silica is 0.27. A range of delay temperature coefficients is obtainable by deposition of a thickness suitable for use with a predetermined bandwidth of frequencies, and several illustrative systems which make use of substantially zero or controlled temperature coefficient surface wave electroacoustic devices are disclosed.

DESCRIPTION OF THE PREFERRED EMBODIMENTS

As previously described, it is known that an acoustic surface wave delay line may be formed from a flat piezoelectric material in a spaced parallel relationship to a flat non-piezoelectric material. If the non-piezoelectric material has interdigital electrode terminations spaced apart thereon then application of an electric signal to one electrode pair will be detected for a given velocity, frequency and propagation path at a later time. However, in accordance with the present invention, it is recognized that the delay time may be made substantially independent of temperature if the piezoelectric and non-piezoelectric materials are selected such that the temperature coefficient of velocity is matched to the thermal expansion coefficient in the materials.

Figure 1:
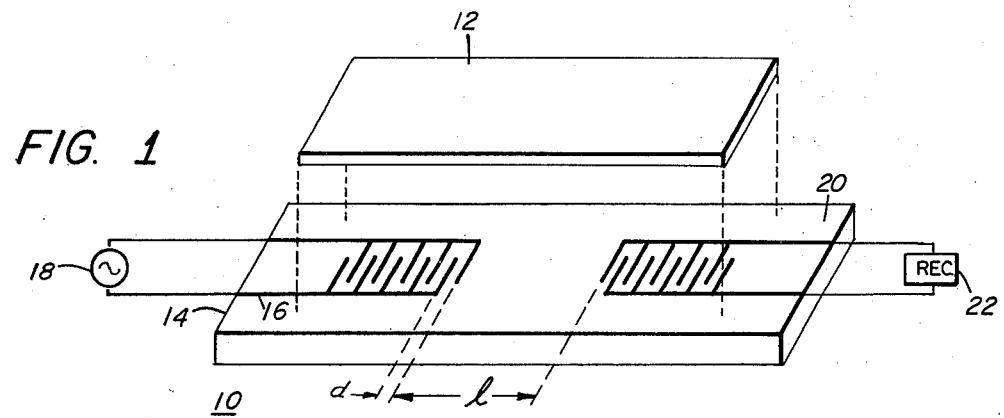
FIG. 1 illustrates a double layer surface wave electroacoustic device in accordance with the prior art.

FIG. 1, which is illustrative of the prior art, is an acoustic surface wave delay line shown generally at 10 which is constructed by bringing a flat piezoelectric material and a flat non-piezoelectric material into close proximity with its surface having disposed thereon two interdigital electrode structures which structures may be made from an evaporated metal film which has been etched by standard photolithographic techniques.

When a piezoelectric material 12 and a non-piezoelectric material 14 are brought into contact and an oscillatory electric signal is applied to a set of transmitting electrodes 16 by a signal source 18, the device will transform some of the electric energy into acoustic energy which will propagate along the piezoelectric substrate 12 in accordance with the relationship $$f = \frac{v}{2d}$$

where $f$ is the signal frequency, $v$ is the acoustic wave velocity on the piezoelectric material and $d$ is the spacing between the elements of one of the interdigital electrode structures. The piezoelectric substrate 12 and the non-piezoelectric material 14 are shown for illustrative purposes as separated as they are, of course, mated together. When the propagating acoustic energy reaches the opposite or receiving set of electrodes 20, an electrical signal is induced in these electrodes in accordance with the previously described relationship. This signal may be detected by a receiver such as receiver 22 of known design, however, the detected signal will have been delayed by the time $$\tau = \frac{l}{v}$$

where $l$ is the distance between the two sets of electrode structures as illustrated.

Variations in the temperature of the two materials results in a change in delay time of the propagated signals which change is given by the following relationship:

$$\Delta \tau = \frac{d\tau}{dT} \Delta T$$

where $$\frac{1}{\tau} \frac{d\tau}{dT} = \frac{1}{l} \frac{dl}{dT} - \frac{1}{v} \frac{dv}{dT}$$

and where $$\frac{1}{\tau} \frac{d\tau}{dT}$$

is the temperature coefficient of delay time where $$\frac{1}{l} \frac{dl}{dT}$$

is the thermal expansion coefficient of the material upon which the electrode structure has been deposited and where $$\frac{1}{v} \frac{dv}{dT}$$

is the temperature coefficient of surface acoustic wave velocity on the piezoelectric substrate 12.

A temperature independent delay time can be achieved if $$\frac{1}{l} \frac{dl}{dT} = \frac{1}{v} \frac{dv}{dT}$$

For most materials the expansion coefficient $$\frac{1}{l} \frac{dl}{dT}$$

is a positive quantity; that is, the length of the piezoelectric material increases with increasing temperature. In crystalline quartz, which is piezoelectric, the temperature coefficient $$\frac{1}{v} \frac{dv}{dT}$$

is also positive in at least two orientations for which the piezoelectric coupling is strong. These orientations are along the X-cut and Y-cut material where $$\frac{1}{v} \frac{dv}{dT}$$

is approximately 30 to 35 × 10$^{-6}$ per degree centigrade for surface waves propagating in the direction for maximum coupling between the electric fields of the interdigital electrodes and the piezoelectric effect. The electrode structure can therefore be made on a substrate such as Bausch and Lomb type T-40 glass as the non-piezoelectric material which is chosen to have a magnitude of thermal expansion coefficient equal to the magnitude of $$\frac{1}{v} \frac{dv}{dT}$$

on the piezoelectric substrate.

Figure 2:
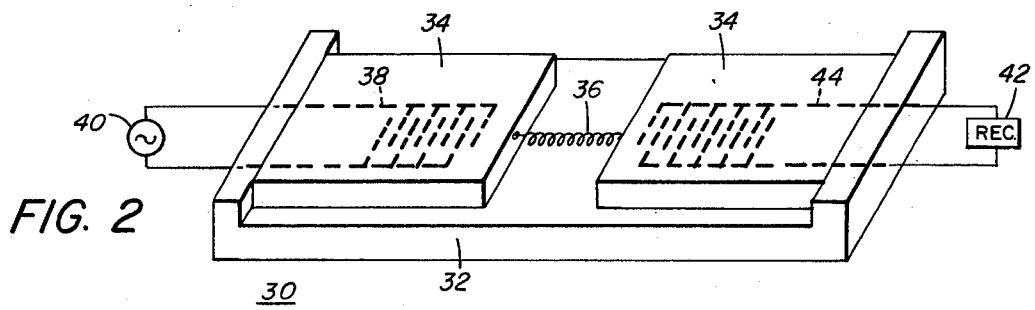
FIG. 2 illustrates a temperature compensated surface wave electroacoustic device in accordance with the present invention.

Referring now to FIG. 2, an embodiment of a temperature compensated surface acoustic wave device in accordance with the present invention is illustrated generally at 30. For most useful piezoelectric materials, the strong coupling direction of the material has a negative value for the thermal expansion coefficient $$\frac{1}{v} \frac{dv}{dT}$$

A compensated delay line may be constructed by depositing the electrode structure on the non-piezoelectric substrate of which substrate 32 is piezoelectric with a thermal expansion coefficient smaller than that of non-piezoelectric material 34. When the substrate 32 is held or secured against non-piezoelectric material 34, as by a spring 36, the effective thermal expansion coefficient $$\frac{1}{l} \frac{dl}{dT}$$

is negative with increasing temperature. The two materials must be chosen such that the net delay line length change compensates for the change in surface wave velocity on the piezoelectric material which is placed above the substrate. The velocity of acoustic waves transmitted by an electrode array 38 in response to waveforms supplied by a signal generator 40 will be independent of the thickness of material 34. These acoustic waves are received by a receiving array 40 and supplied to a receiver 42.

The interdigital electrode structures of most surface wave delay lines are plated directly on the piezoelectric material. In that case $$\frac{1}{l} \frac{dl}{dT} \text{ and } \frac{1}{v} \frac{dv}{dT}$$

are determined by the properties of the piezoelectric material alone and in most cases are not equal thus, $\tau$ has a temperature dependence. It has been discovered that $$\frac{1}{l} \frac{dl}{dT}$$

can be chosen separately after $$\frac{1}{v} \frac{dv}{dT}$$

has been determined for the optimum coupling direction and $\Delta\tau$ can be made to vanish over some temperature range for any piezoelectric material such as quartz, LiNbO$_3$, LiTaO$_3$, ZnO, or CdS.

In the embodiment illustrated by FIG. 2, the temperature dependence of surface acoustic wave velocity may be beneficially obtained with which determination of $$\frac{1}{v} \frac{dv}{dT}$$

it would probably be impossible to construct the device with its resultant use, for example, in radar systems employing delay lines.

By example, piezoelectric substrate 32 may comprise X-cut quartz while Bausch and Lomb type T-40 glass comprises substrate 34. Electrodes 38 and 40 may be plated upon substrate 34 by vacuum deposition techniques. The expansion coefficient of the glass used is approximately $9 \times 10^{-6}$ per degree centigrade. While the electrode arrays are illustrated as being sandwiched between layers 32 and 34, it is to be understood that it is only required that the electrodes be near a piezoelectric layer.

Figure 3:
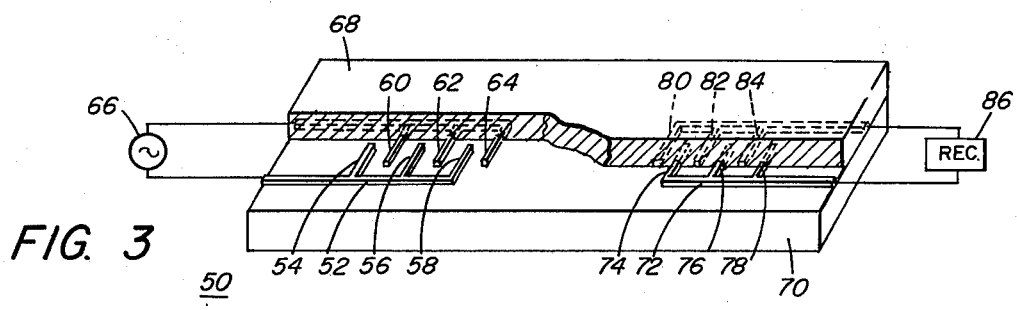
FIG. 3 is illustrative of an alternative embodiment of a temperature compensated electroacoustic device in accordance with the present invention in which a piezoelectric overlay film overlays substantially an entire non-piezoelectric substrate.

Referring now to FIG. 3, a cutaway view of an overlay film surface acoustic wave delay line with a small temperature coefficient of delay is disclosed, generally at 50. A surface acoustic wave is launched by a transmitting electrode array 52 which includes exemplary individual interdigital electrodes 54 through 64; however, it is to be understood that an entire array may actually be present with the electrodes spaced in accordance with the desired frequency response. A signal is applied across electrodes 5 and 60, for example, by signal generator 66 and a surface acoustic wave is launched along the piezoelectric overlay film surface 68 which covers the entire non-piezoelectric substrate 70, which launched wave is received at receiving interdigital electrode array 72 which includes exemplary individual interdigital electrodes 74 through 84. The received electroacoustic wave is coupled from receiving array 72 to a receiver 86.

In the instant embodiment, the interdigital electrode structure is sandwiched between the overlay surface film and the underlying substrate as this arrangement results in greater electromechanical coupling efficiency than placement of the interdigital electrode structure on the surface of the overlay film.

The temperature coefficient of delay of an overlay film delay line depends upon the temperature coefficients of the elastic constants of the substrate and film, the temperature coefficients of the piezoelectric constants of the film, the thermal expansion coefficient of the substrate and the ratio of film thickness to acoustic wavelength. This ratio may be controlled for a given device and operating frequency and the film thickness may be chosen for optimum operation. For example, G. S. Kino, M. Heckman, L. Solie and D. Winslow in *A Theory for Interdigital Raleigh Wave Transducers on a Non-piezoelectric Substrate* in the IEEE Ultrasonics Symposium, San Franciso, Oct. 1970, disclosed that if film thickness to wavelength ratio is near 0.5 maximum electromechanical coupling is achieved. This does not take temperature compensation into account, and will not result in a zero or near zero temperature coefficient of delay.

Since the temperature behavior of a delay line depends upon the film thickness to wavelength ratio, the temperature coefficient of delay may be made small and the coupling efficiency may be made large simultaneously by proper choice of materials and film thickness. Thus, layer 68 must be chosen to effect temperature compensation.

Figure 8:
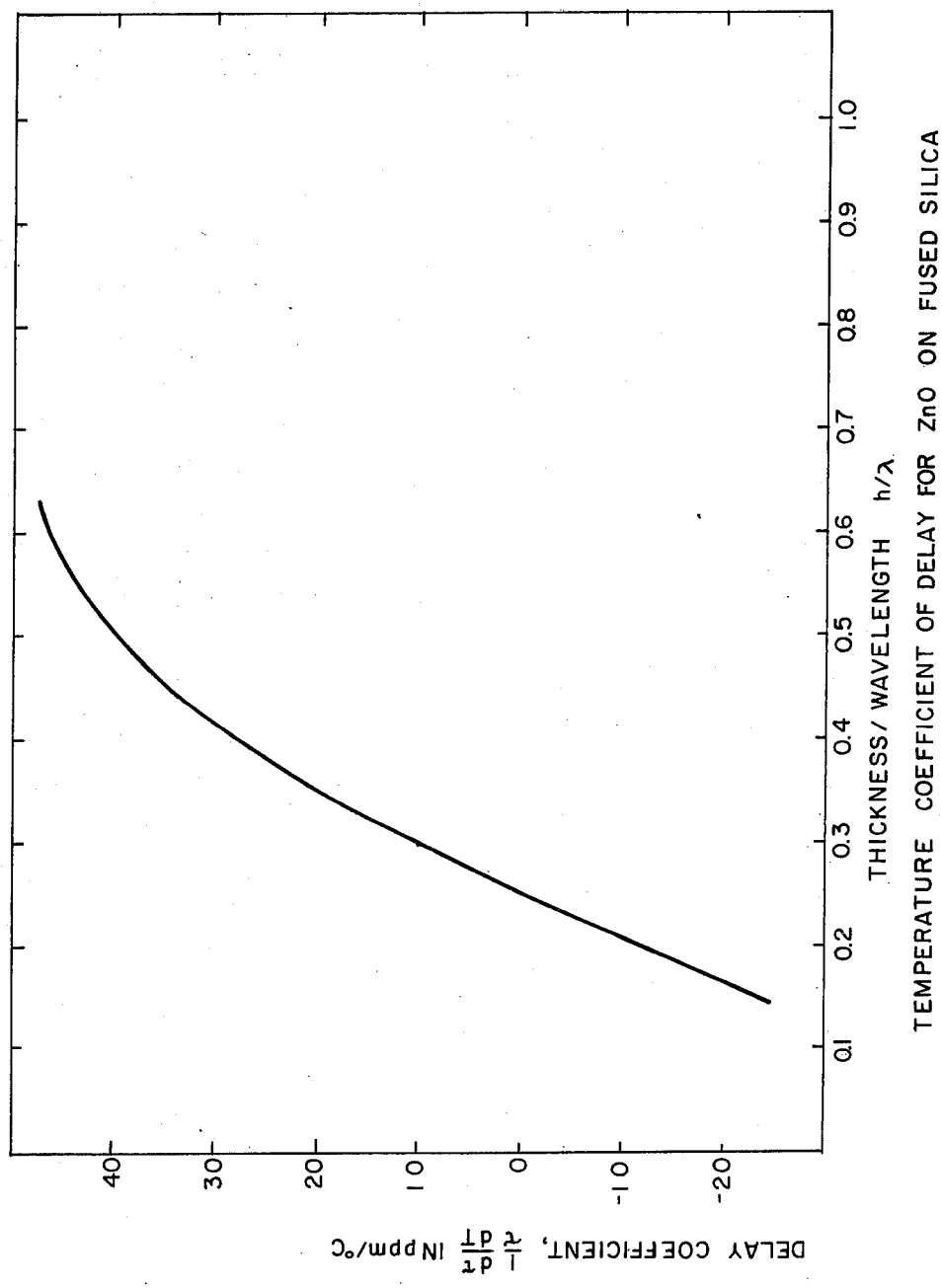
FIG. 8 is a graph of the thickness of wavelength ratio versus the delay temperature coefficient for zinc oxide on fused silica.

Referring now to FIG. 8, which is a plot of the thickness of wavelength ratio $$\frac{h}{\lambda} \text{ versus the delay coefficient } \frac{1}{\tau} \frac{d\tau}{dT}$$

in ppm per degrees centigrade for zinc oxide on fused silica using a sputtered ZnO film. It may be seen from this graph that a sputtered ZnO film on fused silica will give zero temperature coefficient of delay when the thickness to wavelength ratio is near 0.27 with moderately good coupling efficiency and only moderate dispersiveness. Of course, other well-known techniques for the deposition of thin films other than sputtering may be used.

While the data illustrated by the graph of FIG. 8 is applicable to delay lines in which the entire non-piezoelectric surface is covered by the piezoelectric overlay film of ZnO, it is not necessary to cover the entire surface, only the area above the electrode structure need be covered for operation as a delay line. The thickness of the film deposited over the electrode structure may be adjusted to give optimum temperature behavior when there is no film over the rest of the surface. When a range of delay coefficients is required, the overlay film thickness may be deposited to give such a range, as is apparent from the graph, thereby minimizing tolerances on the film thickness. Also, a particular band width rather than a specific frequency is usually required in most applications, hence certain frequencies in that requisite band width may result in some minimal delay, but this delay may be made as small as desired by choosing frequencies corresponding to the film thickness desired or by adjusting the film thickness to the band width requirements.

Figure 4:
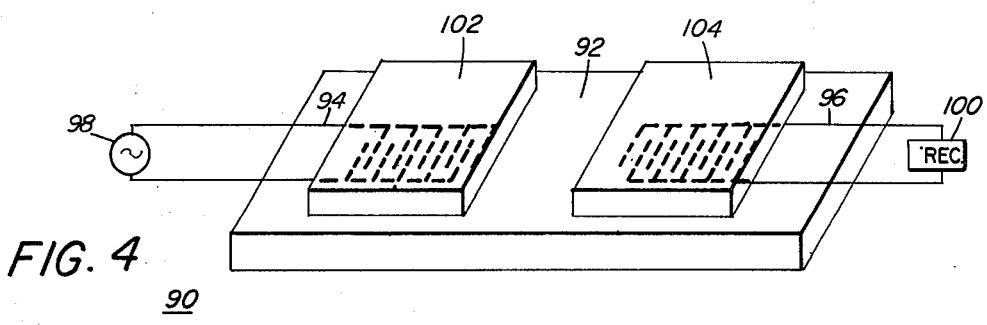
FIG. 4 illustrates another embodiment of a temperature compensated electroacoustic surface wave device in accordance with the present invention in which a piezoelectric overlay film overlays portions of a non-piezoelectric substrate.

Referring now to FIG. 4, an overlay film surface acoustic wave delay line is illustrated generally at 90 in which a non-piezoelectric substrate 92 has plated thereon transmitting and receiving interdigital electrode arrays 94 and 96 respectively, said receiving array 94 having connected thereto a signal source 98 and said receiving interdigital electrode array having connected thereto a receiver 100. In this embodiment, the overlay film surface is plated on the non-piezoelectric substrate only over the electrode portions thereby conserving the piezoelectric material required for overlay film substrate 102 and 104 over receiving array 94 and transmitting array 96 respectively. An electroacoustic wave launched from the electrodes 94 travels along the surface of non-piezoelectric substrate 92 and is received by electrodes 96 sandwiched between the overlay film 104 and the non-piezoelectric substrate 92 thereby causing an acoustic wave to be received corresponding to the acoustic wave transmitted in the device of FIG. 3, the only difference being that all propagation is not and need not be below piezoelectric material as only that portion of the nonpiezoelectric substrate which has interdigital electrodes plated thereon requires a piezoelectric overlay film thereover.

Figure 5:
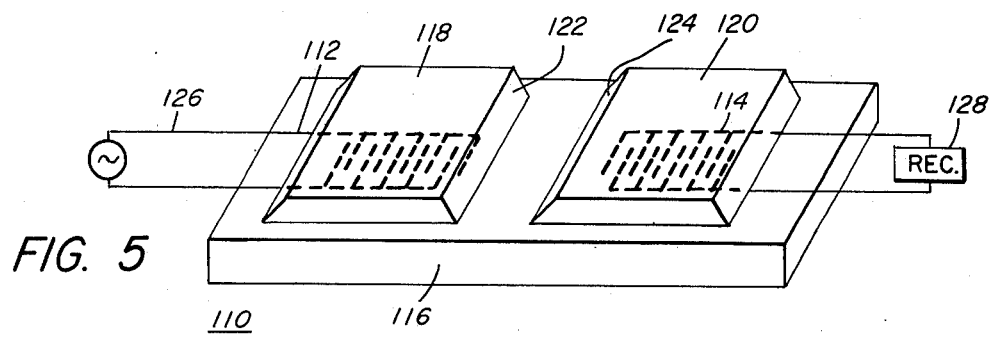
FIG. 5 illustrates another embodiment of a temperature compensated electroacoustic device similar to that illustrated by FIG. 4 in which the piezoelectric overlap film is tapered.

Referring now to FIG. 5, an overlay film surface acoustic wave delay line device similar to that illustrated by FIG. 4 is shown generally at 110 in which transmitting and receiving interdigital electrode arrays 112 and 114 respectively are vacuum deposited upon the surface of a non-piezoelectric substrate 116. Sandwiched between the non-piezoelectric substrate and piezoelectric overlay films 118 and 120 which overlay films are deposited above the receiving and transmitting electrode arrays respectively only with the regions between with piezoelectric overlay films being wholly non-piezoelectric are the electrode arrays. While the temperature behavior of the combination of piezoelectric and nonpiezoelectric materials as a whole is different in the case in which the piezoelectric material is deposited only over the area covered by the interdigital electrode structure rather than the entire non-piezoelectrical substrate as a whole, adjustment of the piezoelectric films 118 and 120 will still result in optimum temperature behavior.

A problem which can occur in a device such as that disclosed by FIG. 4 in which the edges of the overlaying piezoelectric film 102 and 104 are perpendicular to the non-piezoelectric substrate 92 is that distortion can be introduced into the propagated wave. Upon leaving the region of overlap between the piezoelectric film and the non-piezoelectric substrate in the embodiment disclosed by FIG. 5, there is a tapering of the edges, for example edges 122 and 124 associated with the transmitting and receiving electrode arrays 112 and 114 respectively such that the transition of the propagated surface electroacoustic wave is more gradual between the piezoelectric and non-piezoelectric junction to the region of non-piezoelectric material only and also upon reentry of the transmitted wave to the piezoelectric and non-piezoelectric material. Of course, any suitable tapering may be implemented dependent only upon the particular interdigital electrode structure involved and upon the characteristics of the piezoelectric and non-piezoelectric materials such that the proper thickness may be deposited to arrive at substantially perfect temperature compensation. The waveform supplied by signal source 126 is normally chosen to match that which can be generated and transmitted by the particular interdigital structural array 112 and array 114 must also accordingly be matched to the particular transmitted wave form for eventual coupling to a utilization device such as a receiver 128. Of course, the electrode arrays may be apodized or spaced according to the generated waveform, and the simplified arrays 112 and 114 are by way of example only.

Figure 6:
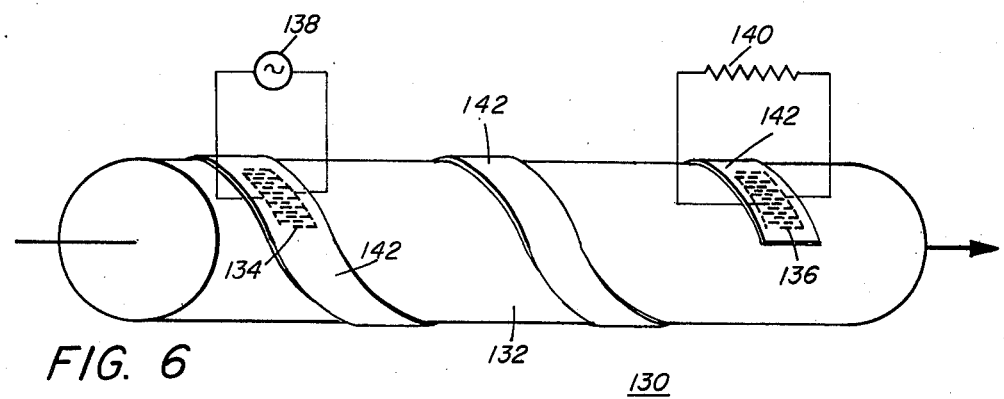
FIG. 6 illustrates a temperature compensated electroacoustic surface wave device in accordance with the present invention in which a continuous surface wave structure is utilized.

Referring now to FIG. 6, another embodiment of an overlay film surface acoustic wave delay line is illustrated generally at 130 wherein a continuous surface wave delay line structure is illustrated. By utilizing a curved surface, additional delay length may be achieved without the use of extra material, both piezoelectric and non-piezoelectric. As illustrated, the curved surface is cylindrical although, of course, other geometric curved surfaces may be utilized. In the present embodiment a cylinder 132 which is illustrated as solid but which, of course, may be hollow, is fabricated of non-piezoelectric material. Deposited thereon as by sputtering or vacuum deposition are the interdigital electrode structures with interdigital electrode array 134 as the transmitting array and interdigital electrode array 136 as the receiving array, with a signal source 138 supplying the appropriate waveforms to be propagated by array 134 and a receiver 140 shown as a load for receiving the output of receiving interdigital electrode array 136. As may be observed, the propagated surface electroacoustic wave will travel spirally around the cylindrical surface after launching from transmitting array 134 to receiving array 136. These electrodes are deposited between the non-piezoelectric substrate 132 and a piezoelectric overlay film surface 142 which is deposited over the interdigital electrode arrays. The piezoelectric film overlay may cover the entire curved surface, in this case the entire cylindrical surface, although in FIG. 6 it is illustrated only as covering the particular region over which the transmitted wave will propagate. Of course, as an alternative the surface overlay film may be constructed as in accordance with FIGS. 4 or 5 and cover only that particular region under which there is an interdigital electrode array.

Such a device as shown by FIG. 6 is useful in those instances in which cost and space make it prohibitive to fabricate a delay of equivalent length on a flat surface. By adjusting the thickness of the film overlay 142 to 0.27, for example, with respect to the wavelength of the central frequency of a predetermined bandwidth substantially zero temperature coefficient of delay is achieved when film 142 is ZnO and cylinder 132 is fused silica.

Figure 7:
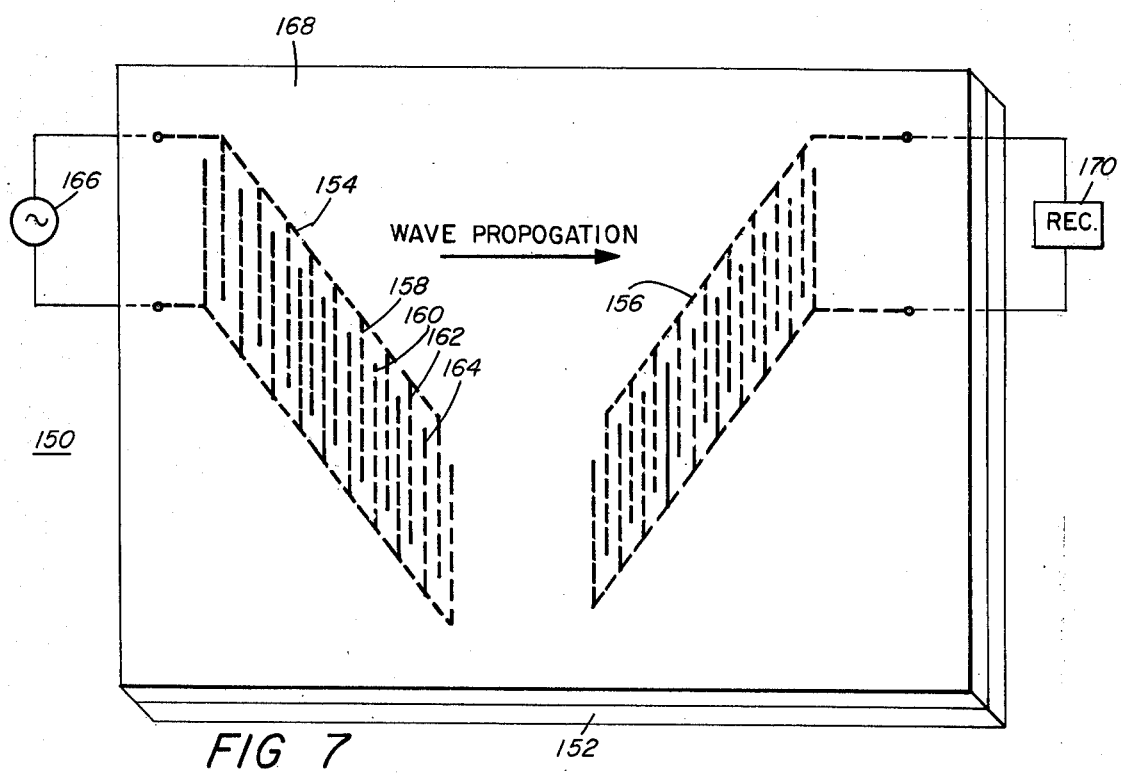
FIG. 7 illustrates a temperature compensated electroacoustic surface wave device in accordance with the present invention in which tilted comb arrays of electrodes are sandwiched between piezoelectric and non-piezoelectric layers.

Referring now to FIG. 7, an electroacoustic overlay film wave shaping device is illustrated generally at 150 in which a non-piezoelectric substrate 152 suitable for the transmission of electroacoustic waves on a surface thereof has deposited thereon an interdigital transmitting electrode array 154 comprising a plurality of metallic interdigital electrodes arranged in a comblike array in a predetermined spatial and geometric relationship and an output or receiver interdigital electrode array similarly arranged in a predetermined spatial and geometric relationship which output array comprises a plurality of metallic and conductive interdigital fingers in a comb structure 156. The individual electrode fingers such as 158, 160, 162 and 164 are parallel with each other and spaced apart distances which are a function of the frequencies to which the individual fingers are responsive in accordance with well-known techniques such as apodization.

The use of high coupling material, which is piezoelectric material is desirable because it allows a large bandwidth with minimum insertion loss. However, this high coupling causes an acoustic wave to be multiply reflected as it travels under an interdigital array such as 154 or 156. These reflections can destroy the amplitude and phase coherence of a launched surface wave necessary to achieve the desired electrical response from the surface wave device. Such a surface wave is launched, for example, by electrical generator 166 which is connected to the transmitting array 154 of the transmitter comb structure. The resultant electric field betweem the interdigital fingers results in the generation and propagation of a wave along the surface of a piezoelectric overlay film surface 168 which is deposited over the electrode arrays 154 and 156 such that these electrode arrays are sandwiched therebetween. The propagated wave is shaped in accordance with the spacing between adjacent electrodes, the overlapping of electrodes, and the axial or tilt of the individual interdigital electrodes with respect to their central axis. The use of a tilted comb array reduces multiple reflection thereby enabling the surface wave generated by any particular interdigital finger to be launched from the transducer without being perturbed by the other fingers of the array. For a large array this perturbation is large and may be reduced in accordance with the degree of axial tilt of the comb array.

By sandwiching the electrode arrays between layers of piezoelectric and non-piezoelectric material, temperature compensation may be achieved in accordance with the present invention by selecting the thickness of the piezoelectric and non-piezoelectric layers such that the temperature compensation is achieved. As previously described, when the piezoelectric material is zinc oxide and the non-piezoelectric substrate is fused silica, a temperature compensated delay line will result for a film thickness to wavelength ratio near 0.27. The output of receiver array 156 may be, of course, processed in a conventional manner by any receiver 170. The piezoelectric overlay film 168 may be deposited only over the electrode arrays if desired. Additionally, instead of sandwiching the electrodes between piezoelectric layer 168 and substrate 152, the electrodes may be deposited directly upon the piezoelectric film 152; however, greater coupling efficiency results in the electrode sandwich embodiment as illustrated by FIG. 7.

Figure 9:
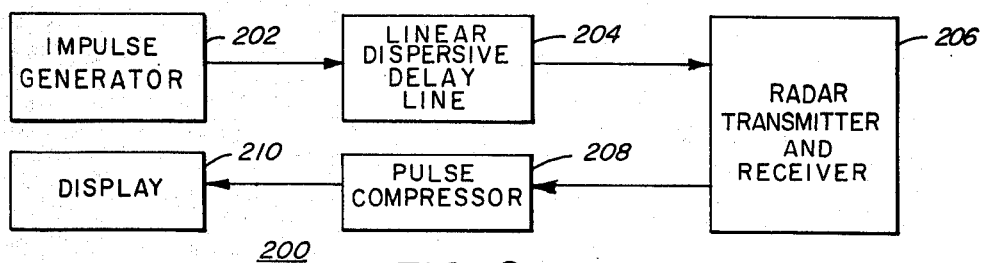
FIG. 9 is a block diagram of a radar system which employs electroacoustic surface wave devices in accordance with the present invention.

Referring now to FIG. 9, a general block diagram of a linear chirp radar system which may utilize a linearly dispersive delay line constructed in accordance with FIG. 7 is shown generally at 200. An impulse generator 202 generates an energy pulse which excites linearly dispersive delay line 204 in which a tilted comb temperature compensated array is disposed between layers of piezoelectric and non-piezoelectric material which array disperses the generated energy pulse to produce, for example, a linearly frequency chirped waveform suitable for pulse compression techniques. The waveform is then transmitted by a conventional pulse compression-type radar transmitter-receiver unit 206 and the return signal is compressed in a pulse compression circuit 208 comprising an array in accordance with that of FIG. 7 for display on a radar screen 210. An improved signal results as the linearly dispersive delay line 204 is able to produce the desired signal more exactly thereby enabling pulse compressor 208 to act only on those frequencies which occur within the desired bandwidth and eliminates those extraneous frequencies by the improved reproduction of the original signal by linearly dispersive delay line 204.

Figure 10:
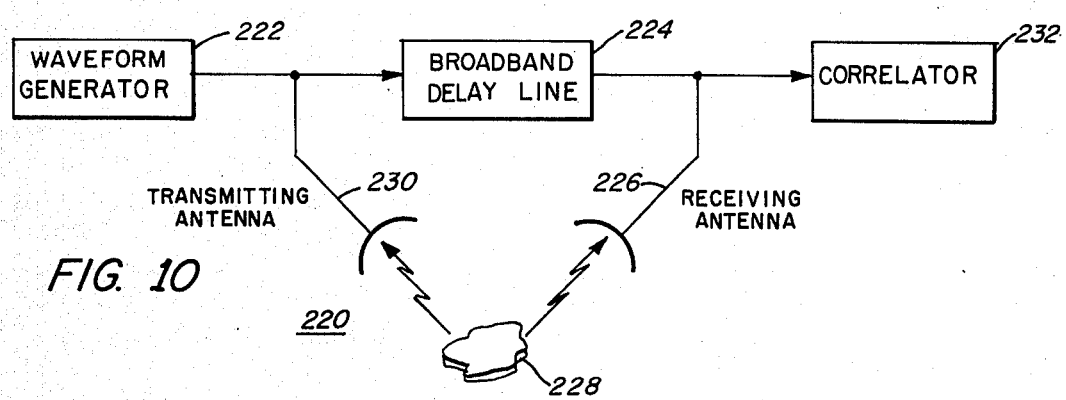
FIG. 10 is a block diagram of a broad band delay line using electroacoustic surface wave devices in accordance with the present invention.

Referring now to FIG. 10, a general block diagram illustrating the use of temperature compensated delay lines of the present invention for a broad band delay line is shown generally at 220. In correlation type radar systems using either autocorrelation or cross-correlation techniques, the transmitted signal is formed by a waveform generator 222 which signal may be delayed by a broad band delay line 224 and combined with the reflected signal received via antenna 226 from a target or cluster of targets 228 resulting from the transmission of the generated waveform via transmitting antenna 230. The received target echo is correlated at a correlator 232 in the radar receiver with an original delayed replica of the signal generated by waveform generator 222 which delayed replica is generated in the broad band delay line 224 thereby resulting in cross-correlation of the received signal with the delayed signal at correlator 232. When the temperature compensated tilted comb arrays of the present invention are utilized as the broad band delay line 224 an improved phase response results with minimum frequency distortion.

Figure 11:
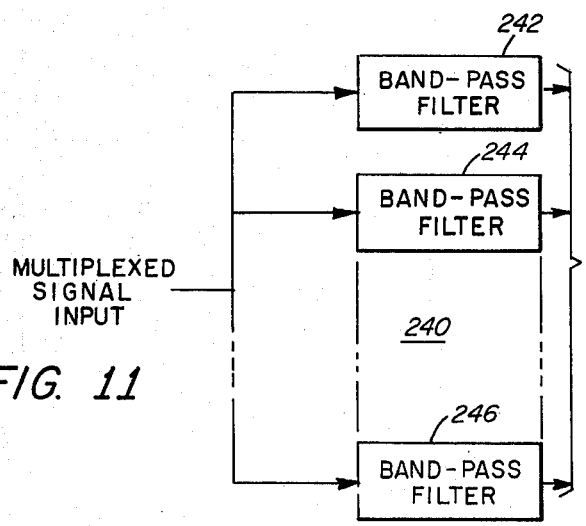
FIG. 11 is a block diagram of a band-pass filter for the reception of multiplexed signals using surface wave devices in accordance with the present invention.

Another application of the temperature compensated overlay film substrate tilted comb structure of the present invention is illustrated by FIG. 11 in which these surface wave devices are utilized as a series of bandpass filters shown generally at 240 for use in systems in general requiring filtering of multiplexed input signals into a plurality of output signals with minimum interaction between the various frequency signals resulting from reflection in the acoustic surface wave device. By employing the structure of, for example, FIG. 3 of the present invention as band-pass filters 242, 244 and 246 an improved filtering system is obtained.

Figure 12:
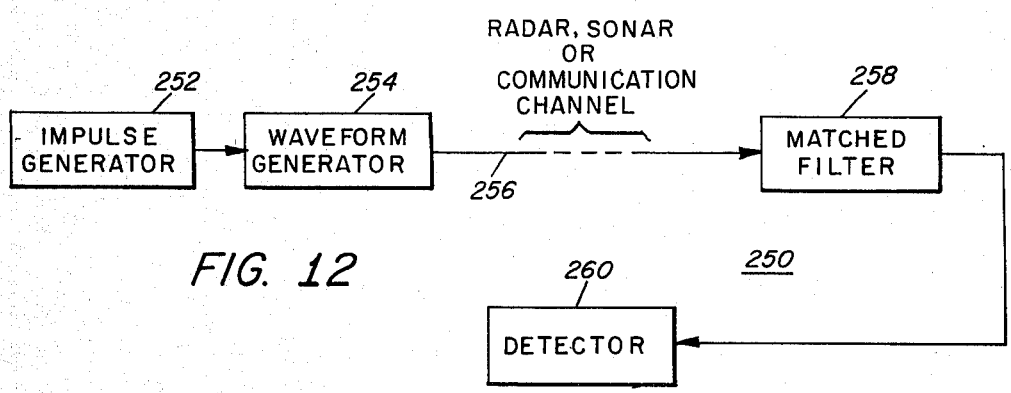
FIG. 12 is a general block diagram of a matched filter system using surface wave devices of the present invention for both transmission and reception of various waveforms.

Referring now to FIG. 12, a generated block diagram of a system for the generation and detection of waveforms such as phase coded signals, linear FM signals, nonlinear FM signals, or signals with special coding is illustrated generally at 250 in which signals generated by an impulse generator 252 of conventional design are coupled to temperature compensated overlay substrate tilted comb structures either with or without apodizing in accordance with the present invention with a waveform generator 254 which generates the phase coded signals, FM signals, nonlinear FM signals or signals with special coding depending only on the interdigital comb design parameters, i.e., electrode configuration, separation, degree of tilt, degree of apodization and film thickness. The output of waveform generator 254 is coupled through either a radar, sonar or communication channel 256 in general to a matched filter 258 which matched filter comprises a temperature compensated tilted comb surface wave device designed to match whatever waveform is generated by waveform generator 254 and the output of which matched filter may be detected by a conventional detector 260.

While particular embodiments of the invention have been shown and described, various modifications thereof will be apparent to those skilled in the art, and therefore it is not intended that the invention be limited to the disclosed embodiments or to details thereof and departures may be made therefrom within the spirit and scope of the invention as defined in the appended claims.

What is claimed is:

1. The method of forming a surface wave delay line comprising the steps of:
   depositing at least an electrode array upon a non-piezoelectric substrate; and
   depositing a piezoelectric overlay film on said electrode array, the thickness of said film being such that the temperature coefficient of delay of surface waves is substantially zero at at least one wavelength of said surface waves.

2. The method in accordance with claim 1 wherein said substrate is of a thickness large with respect to said wavelength.

3. The method in accordance with claim 2 wherein the step of depositing the overlay film comprises the vacuum deposition of zinc oxide on a fused silica substrate.

4. The method in accodance with claim 1 wherein said step of depositing said electrode array comprises forming a metal film on said substrate and removing portions of said film to form said array.

5. The method in accordance with claim 4 wherein said substrate comprises fused silica.

6. The method of forming a surface wave delay line comprising the steps of:
   depositing at least an electrode array upon a piezoelectric substrate; and
   depositing a non-piezoelectric overlay film on said electrode array, the thickness of said film being such that the temperature coefficient of delay of surface waves is substantially zero at at least one wavelength of said surface waves.

7. The method in accordance with claim 6 wherein said substrate is of a thickness large with respect to said wavelength.

8. The method of claim 7 wherein said step of depositing an electrode array comprises forming a metal film on said substrate and removing portions of said film to form said array.

9. The method of claim 8 wherein said overlay film comprises a compound of oxygen.

10. The method of claim 9 wherein said substrate comprises zinc oxide.

* * * * *